United States Patent [19]

Hatanaka

[11] Patent Number: 5,587,598
[45] Date of Patent: Dec. 24, 1996

[54] SEMICONDUCTOR DEVICE WITH CHARGE-UP PREVENTING FUNCTION

[75] Inventor: Kazuhisa Hatanaka, Kitakami, Japan

[73] Assignee: Kabushiki Kaisha Toshiba, Kawasaki, Japan

[21] Appl. No.: 598,138

[22] Filed: Feb. 7, 1996

Related U.S. Application Data

[63] Continuation of Ser. No. 186,846, Jan. 27, 1994, abandoned.

[30] Foreign Application Priority Data

Jan. 27, 1993 [JP] Japan .................................. 5-011622

[51] Int. Cl.⁶ .......................... H01L 23/62; H01L 29/00
[52] U.S. Cl. ..................... 257/355; 257/356; 257/357; 257/529
[58] Field of Search ................................. 257/355, 356, 257/357, 529, 530

[56] References Cited

U.S. PATENT DOCUMENTS

| | | | |
|---|---|---|---|
| 3,712,995 | 1/1973 | Steudel | 257/357 |
| 4,015,147 | 3/1977 | Davidson et al. | 257/357 |
| 4,231,149 | 11/1980 | Chapman et al. | 257/442 |
| 4,801,558 | 1/1989 | Simmons et al. | 257/529 |
| 4,941,028 | 7/1990 | Chen et al. | 257/530 |
| 5,341,267 | 8/1994 | Whitten et al. | 257/530 |
| 5,369,054 | 11/1994 | Yen et al. | 257/530 |

*Primary Examiner*—J. Carroll
*Attorney, Agent, or Firm*—Banner & Witcoff, Ltd.

[57] ABSTRACT

Disclosed is a semiconductor device comprising a silicon substrate, a pad provided on the substrate and an integrated circuit portion provided in the substrate. The pad and the integrated circuit portion are electrically connected together by a first wiring layer. The pad and the substrate are electrically connected together by a second wiring layer. The second wiring layer includes a fuse portion. The first wiring layer is always grounded via the fuse portion while processing the device.

15 Claims, 5 Drawing Sheets

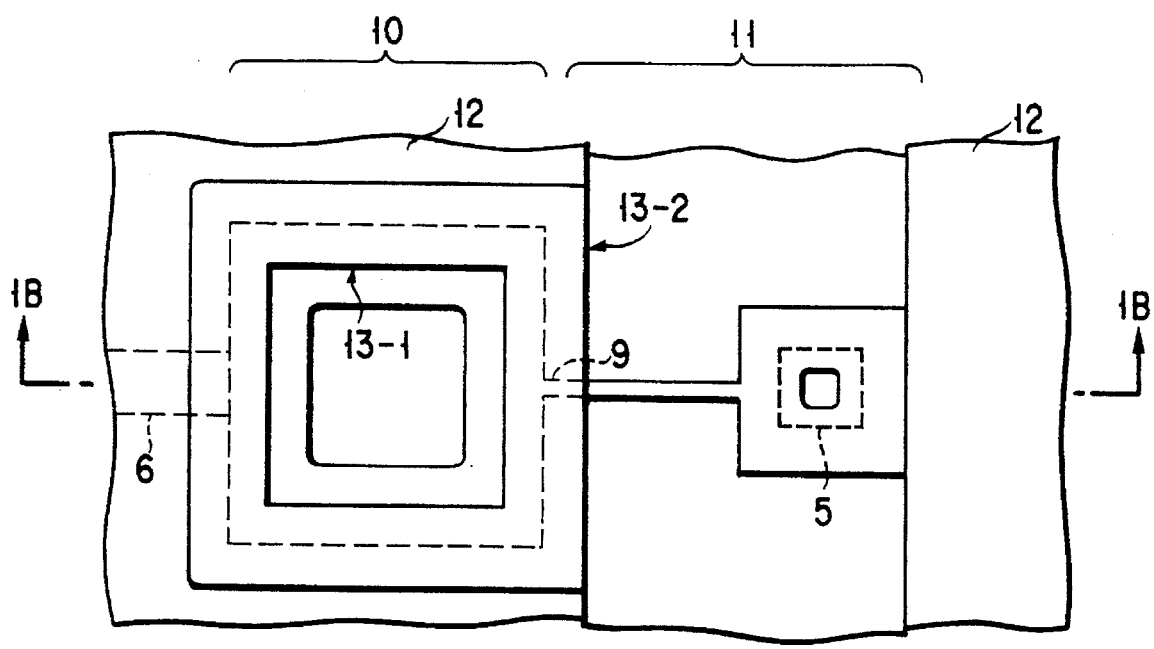
F I G. 1A
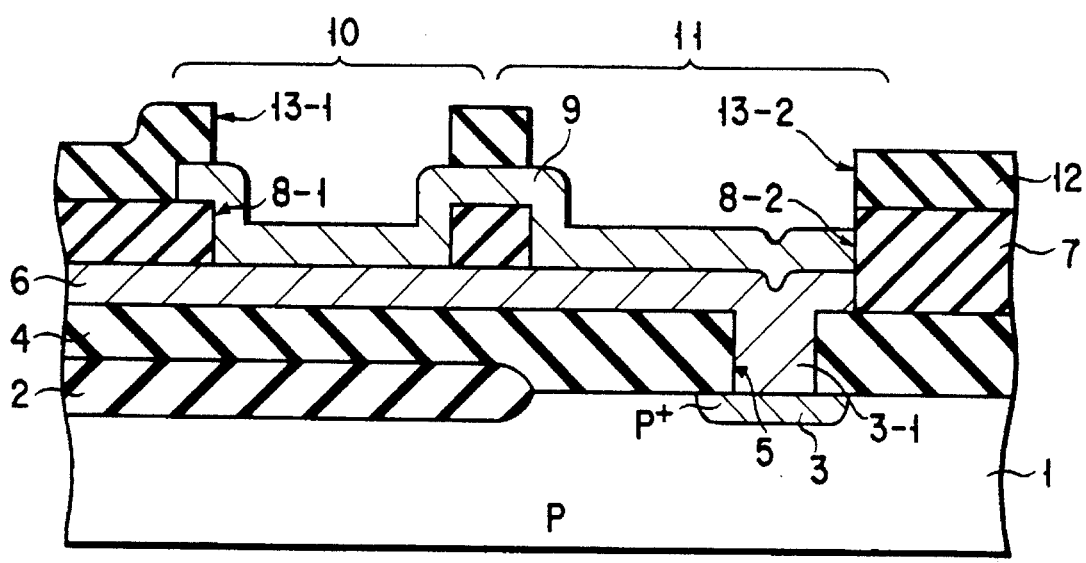
F I G. 1B

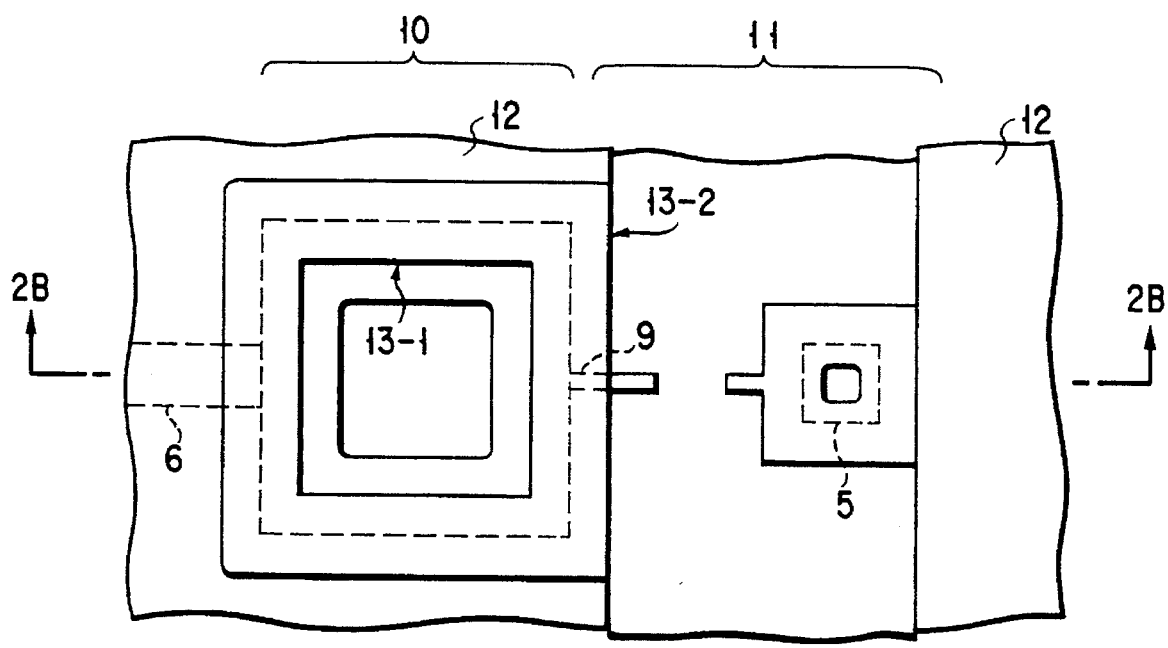
F I G. 2A
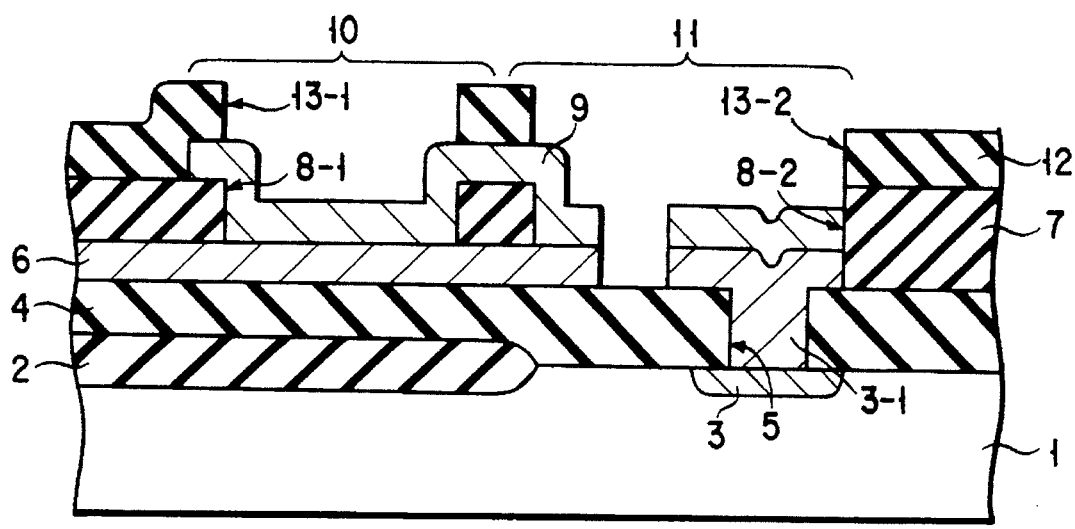
F I G. 2B

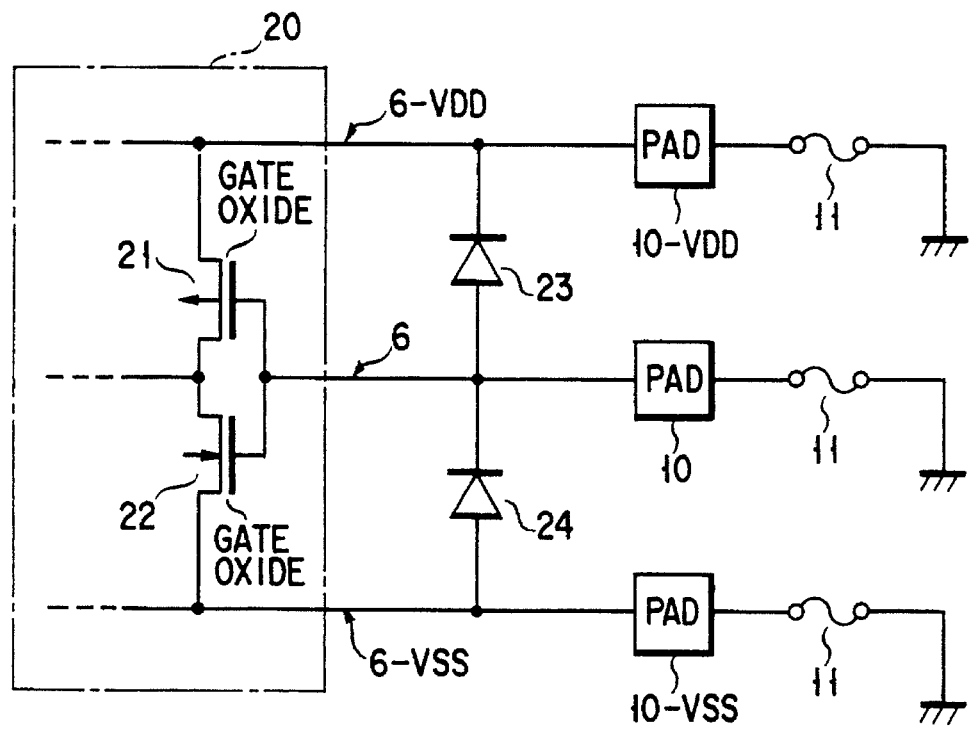
F I G. 3
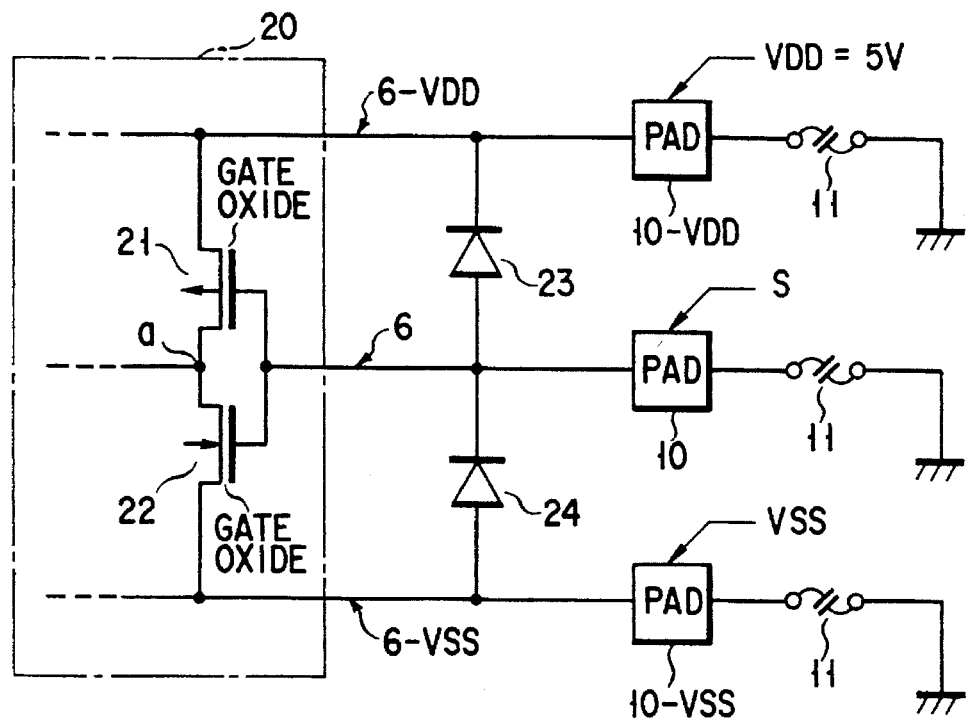
F I G. 4

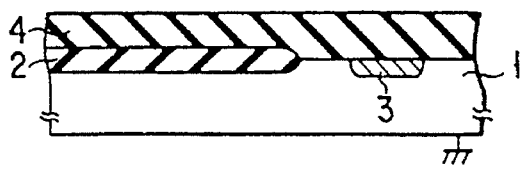
F I G. 5A
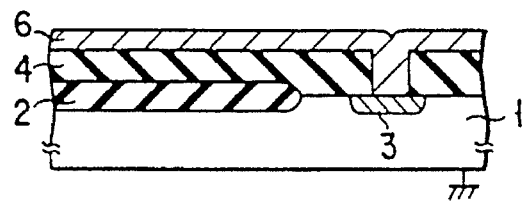
F I G. 5B
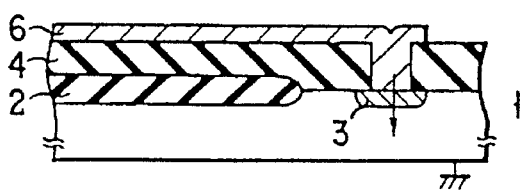
F I G. 5C
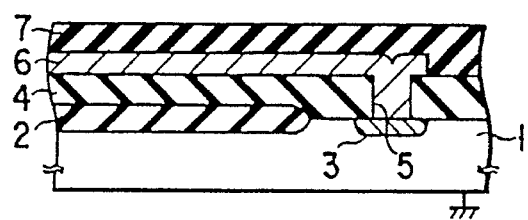
F I G. 5D
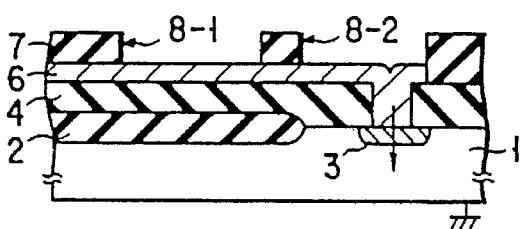
F I G. 5E
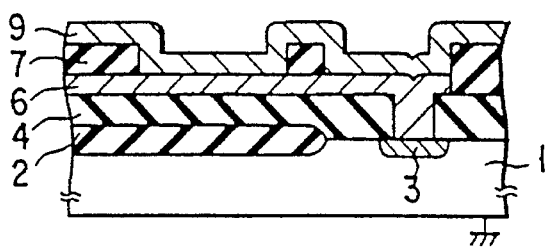
F I G. 5F
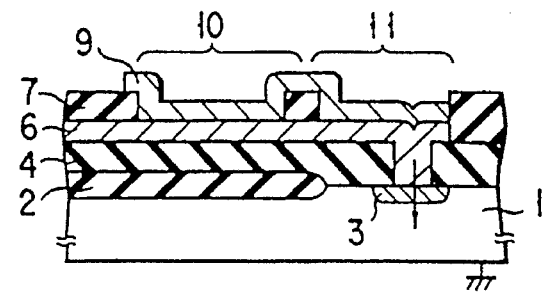
F I G. 5G
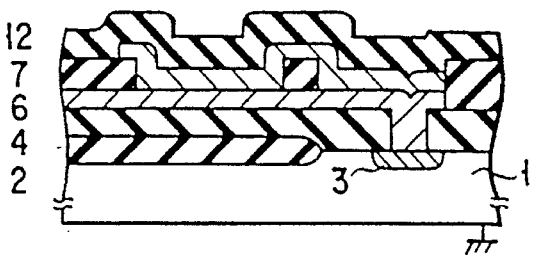
F I G. 5H
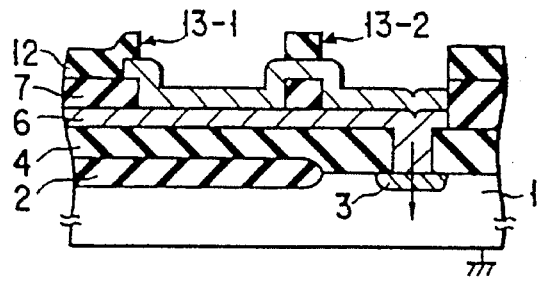
F I G. 5I

SEMICONDUCTOR DEVICE WITH CHARGE-UP PREVENTING FUNCTION

This application is a continuation of application Ser. No. 08/186,846, filed Jan. 27, 1994, now abandoned.

BACKGROUND OF THE INVENTION

1. Field of the Invention

The present invention relates to a semiconductor device, and, more particularly, to a semiconductor device suitable to be fabricated by a processing method involving plasma.

2. Description of the Related Art

Conventionally, a protective diode is connected to a wiring layer which connects the input/output (I/O) pad to an integrated circuit (IC) portion as one means to protect a thin insulating film, such as the gate insulating film of a MOSFET which is one of the elements constituting an integrated circuit, against an excess voltage.

When a positive excess voltage is supplied to the I/O pad, for example, the protective diode breaks down to permit a current to flow to a low-potential power supply $V_{SS}$, thus absorbing the positive excess voltage. When a negative excess voltage is supplied to the I/O pad, the protective diode also breaks down to permit a current to flow to a high-potential power supply $V_{DD}$, thus absorbing the negative excess voltage.

Such a protective diode works effectively with respect to the positive and negative excess voltages only when the power supply potentials are fixed to $V_{DD}$ and $V_{SS}$. The protective diode does not perform the protecting function when only the substrate potential is fixed and the I/O pad or internal wiring layer are in a floating state as during the fabrication of the device. If charged particles contact the wiring layer in a floating state while processing a semiconductor device by a method using the charged particles such as a plasma method, charge-up occurs in the wiring layer, damaging a thin insulating film, such as the gate insulating film of a MOSFET that is a constituent of the IC. When the insulating film in the IC is damaged, an insulation defect like short-circuiting occurs, making the semiconductor device defective.

As described above, the I/O pad and the internal wiring layer are in a floating state during fabrication of the conventional semiconductor device (wafer processing), so that if charged particles hit against the conductive layer constituting the I/O pad and internal wiring layer, the conductive layer would be charged up. If charge-up occurs in the conductive layer, thin insulating films such as the gate insulating films of MOSFETs constituting an IC may break down.

SUMMARY OF THE INVENTION

It is therefore an object of the present invention to provide a semiconductor device which will protect insulating films in an IC while processing the semiconductor device (during wafer processing).

It is another object of the present invention to provide a semiconductor device which will protect insulating films in an IC over the entire stage from during fabrication of the semiconductor device to after the fabrication.

To achieve those objects, according to this invention, there is provided a semiconductor device comprising a semiconductor substrate; an integrated circuit portion formed in the substrate; a conductive layer electrically connected to the integrated circuit portion; and a wiring layer electrically connected to the conductive layer to prevent charge-up from occurring in the conductive layer during a wafer process. This wiring layer sets the conductive layer to the ground potential during the wafer process.

According to the semiconductor device with the above structure, the conductive layer is always set to the ground potential during a wafer process, so that even if charged particles hit against the conductive layer, the conductive layer will not be charged up. It is therefore possible to protect a thin insulating film, such as the gate insulating film of a MOSFET that is a constituent of the integrated circuit portion, against damage while processing the semiconductor device.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 1A is a plan view showing the essential portion of a semiconductor device according to one embodiment of the present invention;

FIG. 1B is a cross-sectional view taken along line 1B—1B in FIG. 1A;

FIG. 2A is a plan view showing the semiconductor device according to this embodiment of the present invention after the fuse of this device is cut;

FIG. 2B is a cross-sectional view taken along line 2B—2B in FIG. 2A;

FIG. 3 is a circuit diagram showing the device with the fuse uncut;

FIG. 4 is a circuit diagram showing the device with the fuse cut;

FIGS. 5A through 5I are cross-sectional views showing the semiconductor device according to this embodiment of the invention step by step;

DETAILED DESCRIPTION OF THE PREFERRED EMBODIMENT

Figure 6:
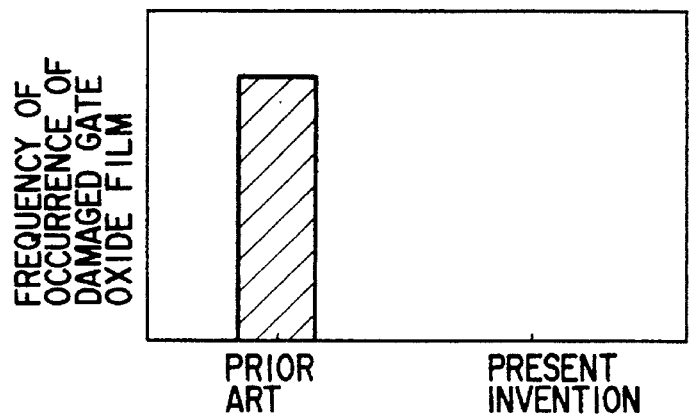
FIG. 6 is a diagram showing the frequency of occurrence of a broken gate oxide film in the semiconductor device according to this embodiment of the invention in comparison with that of a semiconductor device which does not embody this invention.

A preferred embodiment of the present invention will now be described referring to the accompanying drawings.

FIG. 1A presents a plan view showing the essential portion of a semiconductor device according to one embodiment of the present invention, and FIG. 1B a cross-sectional view taken along line 1B—1B in FIG. 1A.

As shown in FIGS. 1A and 1B, a field oxide film 2 is formed in the surface region of a P type (or N type) silicon substrate 1. The field oxide film 2 isolates active devices, such as MOSFETs, which constitute an integrated circuit (IC), from one another in an IC portion (not shown).

A diffusion layer 3 of the same conductivity type as the substrate 1 is formed in the surface region of the substrate 1. As the conductivity type of the substrate 1 is the P type in this embodiment, the diffusion layer 3 will be called heavily dope. $P^+$ type diffusion layer 3.

A first interlayer insulating film 4 of an insulating material, such as a silicon dioxide film, is formed over the surface of the substrate 1. Formed in the first interlayer insulating film 4 is an opening 5 which communicates with the $P^+$ diffusion layer 3. A first conductive layer 6 of a conductive material, such as an aluminum alloy or silicide, is formed on the first interlayer insulating film 4. The first conductive layer 6 is connected via the opening 5 to the $P^+$ diffusion layer 3. The first conductive layer 6 in the opening 5 serves as a wiring layer 3-1 that always provides the ground potential during a wafer process. The first conductive layer 6 is set to have the same potential as the $P^+$ diffusion layer 3 while it is connected to the $P^+$ diffusion layer 3. The first conductive layer 6 connects the gate electrodes of MOSFETs, the internal wiring layer of an IC, or the like in the IC portion (not shown).

Formed on the first interlayer insulating film 4 is a second interlayer insulating film 7 of an insulating material such as a silicon dioxide film. The second interlayer insulating film 7 covers the first conductive layer 6. Openings 8-1 and 8-2, which communicate with the first conductive layer 6, are formed in the second interlayer insulating film 7. Formed on the second interlayer insulating film 7 is a second conductive layer 9 of a conductive material, such as an aluminum alloy. The second conductive layer 9 is connected via the openings 8-1 and 8-2 to the first conductive layer 6. The second conductive layer 9 is set to have the same potential as the first conductive layer 6 while it is connected to this conductive layer 6. In this embodiment, the second conductive layer 9 constitutes an I/O pad portion 10 and a fuse portion 11. The I/O pad portion 10 is connected via the opening 8-1 to the first conductive layer 6, and the fuse portion 11 is connected via the opening 8-2 to the first conductive layer 6.

The I/O pad portion 10 and fuse portion 11 are connected together by the first conductive layer 6, and are also connected together since they are integrally formed by the second conductive layer 9.

Formed on the second interlayer insulating film 7 is a passivation film 12 of an insulating material such as a silicon dioxide film. The passivation film 12 covers the second conductive layer 9. Formed in the passivation film 12 are an opening 13-1 which communicates with the I/O pad portion 10, and an opening 13-2 which communicates with the fuse portion 11.

According to the semiconductor device having the above structure, the first conductive layer 6 and the second conductive layer 9 are electrically connected to the substrate 1. The first and second conductive layers and 9 are always set to the ground potential while the semiconductor device is being processed (wafer process) by grounding the substrate 1 during fabrication of the semiconductor device. Even if there is a plasma etch during the process, therefore, the first and second conductive layers 6 and 9 will not be charged up.

Even when positive or negative charges hit against the first and second conductive layers 6 and 9, therefore, the potential induced by the charges entirely flows to the substrate 1 at the ground potential. Therefore, excess voltage will not be applied to a thin insulating film in the semiconductor device, as typified by the gate oxide film of a MOSFET, thus protecting the thin insulating film.

FIG. 2A is a plan view showing the semiconductor device according to this embodiment of the present invention after the fuse of this device is cut, and FIG. 2B is a cross-sectional view taken along line 2B—2B in FIG. 2A.

The fuse portion 11 is cut when the wafer process is completed and the device comes ready for a die-sort test. Cutting the fuse portion 11 electrically isolates the first and second conductive layers 6 and 9 from the substrate 1. The device thus comes to a state where the IC portion can operation without interference.

As one way of cutting the fuse portion 11, a large current is permitted to flow to the I/O pad portion 10 to self-cause electro-migration in the fuse portion 11, thus cutting the fuse portion 11. To smoothly perform the cutting by this method, the cross section of the conductive layer of the fuse portion 11 is made thinner than the internal wiring layer, for example the first conductive layer 6.

Alternatively, a laser beam may be irradiated on the fuse portion 11 to cut it. Even after the fuse portion 11 is cut by such a method, the IC portion will properly function by supplying a predetermined potential and a predetermined signal to the I/O pad portion 10.

FIG. 3 is a circuit diagram showing the first conductive layer 6 grounded via the fuse portion 11, and FIG. 4 is a circuit diagram showing the fuse portion 11 cut and a predetermined potential supplied to the I/O pad portion 10.

As shown in FIG. 3, the first conductive layer 6, a high-potential power source line 6-$V_{DD}$ and a low-potential power source line 6-$V_{SS}$ are grounded via the fuse portion 11 before the fuse portion 11 is cut.

As shown in FIG. 4, the floating state of the I/O pad portion 10 will be released by supplying a predetermined potential and a predetermined signal to the I/O pad portion 10, a high-potential power supply pad 10-$V_{DD}$ and a low-potential power supply pad 10-$V_{SS}$ after the fuse portion 11 is cut. An IC portion 20 is formed in the substrate 1. What is provided in the IC portion 20 includes an inverter circuit which comprises a PMOS 21 and an NMOS 22 connected in series between the high-potential power source line 6-$V_{DD}$ and low-potential power source line 6-$V_{SS}$.

The PMOS 21 and NMOS 22 are given the operational power by supplying a high potential $V_{DD}$ (e.g., 5V) to the pad portion 10-$V_{DD}$ and a low potential $V_{SS}$ (e.g., 0V) to the pad portion 10-$V_{SS}$. When a predetermined signal S is supplied to the I/O pad portion 10 under this condition, a signal which is the signal S whose level is inverted is output from a node "a".

Further, the operation power is given to a first diode 23 having an anode connected to the first conductive layer 6 and a cathode connected to the high-potential power source line 6-$V_{DD}$ and to a second diode 24 having a cathode connected to the first conductive layer 6 and an anode connected to the low-potential power source line 6-$V_{SS}$. Those first and second diodes 23 and 24 are protective diodes. When a low-potential surge is input to the I/O pad portion 10, the first diode 23 breaks down to permit a current to flow to the first conductive layer 6 from the high-potential power source line 6-$V_{DD}$, thus raising the potential of the first conductive layer 6. When a high-potential surge is input to the I/O pad portion 10, the second diode 24 breaks down to permit a current to flow to the low-potential power source line 6-$V_{SS}$ from the first conductive layer 6, thus dropping the potential of the first conductive layer 6.

After the fuse portion 11 is cut, therefore, thin insulating films, such as the gate oxide films of the MOSFETs 21 and 22, are protected by the protective diodes 23 and 24.

As apparent from the above, the semiconductor device according to this embodiment can protect thin insulating films over the entire stage from during fabrication of the semiconductor device to after the fabrication.

A description will now be given of a method of fabricating the semiconductor device according to the above-described embodiment.

FIGS. 5A through 5I are cross-sectional views showing the main procedures of the fabrication step by step.

First, the field oxide film 2 is formed in the surface region of the P type silicon substrate 1 using the known LOCOS method, as shown in FIG. 5A. Then, the P$^+$ diffusion layer 3 is formed in the surface region of the substrate 1 using ion implantation to form the source and drain of each MOSFET. Next, an insulating material such as silicon dioxide is deposited on the entire surface of the substrate 1 using the CVD method, forming the first interlayer insulating film 4.

Then, the opening 5 which communicates with the P$^+$ diffusion layer 3 is formed in the first interlayer insulating film 4 as shown in FIG. 5B. Next, a conductive material such as silicide is deposited on the entire surface of the substrate 1 using the CVD method, or a conductive material such as an aluminum alloy is deposited on the entire surface of the substrate 1 using the sputtering method, thus forming the first conductive layer 6. At this time, the first conductive layer 6 is also formed in the opening 5 and is connected via this opening 5 to the substrate 1.

Next, the selected portion of the first conductive layer 6 is etched by photoetching, thus forming a desired internal wiring layer pattern as shown in FIG. 5C. Although the ion-involved RIE method is used in this etching, as the first conductive layer 6 is connected to the substrate 1 set to the ground potential, charges induced by the collision of ions on the first conductive layer 6, if occurred, would all flow to the substrate 1.

Then, an insulating material such as silicon dioxide is deposited on the entire surface of the substrate 1 using the CVD method, forming the second interlayer insulating film 7, as shown in FIG. 5D.

Next, the selected portion of the second interlayer insulating film 7 is etched by photoetching to form the openings 8-1 and 8-2 which communicate with the first conductive layer 6, as shown in FIG. 5E. Although the ion-involved RIE method is used in this etching, as the first conductive layer 6 is grounded, even the collision of ions on the first conductive layer 6 will not charge up the first conductive layer 6 as in the step illustrated in FIG. 5C.

Then, a conductive material such as an aluminum alloy is deposited on the entire surface of the substrate 1 using the sputtering method, thus forming the second conductive layer 9, as shown in FIG. 5F.

Next, the selected portions of the second conductive layer 9 are etched by photoetching to form the I/O pad portion 10, the fuse portion 11, etc., as shown in FIG. 5G. Although the RIE method is also used in this etching, as the second conductive layer 9 is grounded via the first conductive layer 6, even the collision of ions on the second conductive layer 9 will not charge up the first conductive layer 6 and the second conductive layer 9.

Then, an insulating material such as silicon dioxide is deposited on the entire surface of the substrate 1 using the CVD method, thus forming the protective film 12, as shown in FIG. 5H.

Next, the selected portions of the protective film 12 are etched by photoetching to form the openings 13-1 and 13-2 which communicate with the I/O pad portion 10 and the fuse portion 11, as shown in FIG. 5I. Even if the RIE method is used in this etching, the first conductive layer 6 and the second conductive layer 9 will not be charged up as in the step of FIG. 5G.

FIGS. 6, 7A, 7B and 8 are diagrams for explaining the advantages of this invention.

FIG. 6 is a diagram showing the frequency of occurrence of a broken gate oxide film in a device embodying this invention (which has the grounding fuse portion 11) in comparison with that of a different device which does not have the fuse portion 11. As is apparent from FIG. 6 showing the likelihood of the occurrence of a damaged gate oxide film, the frequency of occurrence of such a damage is smaller in the device of this invention having the grounding fuse portion 11 than in the comparative device.

It is thus understood that the provision of the grounding fuse portion 11 in the I/O pad portion 10 will protect the gate oxide film.

Figure 7A:
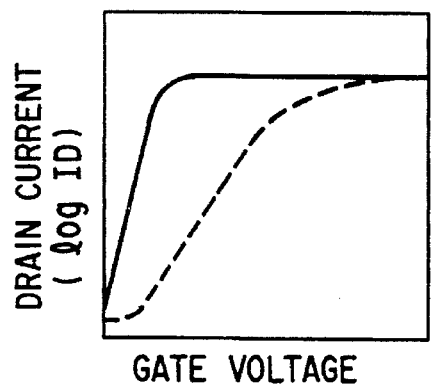
FIG. 7A is a diagram showing the relationship between the drain current and gate voltage in a semiconductor device which does not embody this invention.
Figure 7B:
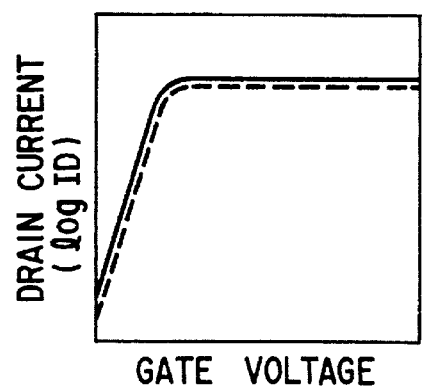
FIG. 7B is a diagram showing the relationship between the drain current and gate voltage in the semiconductor device according to this embodiment of the invention.

FIGS. 7A and 7B present diagrams each showing the relationship between the drain current and gate voltage. More specifically, FIG. 7A shows the relationship between the drain current and gate voltage in the device which does not embody this invention, and FIG. 7B shows the relationship between the drain current and gate voltage in the device embodying this invention.

In FIGS. 7A and 7B, the solid lines indicate the mentioned relationship before a plasma damage occurs while the broken lines indicate the mentioned relationship after the occurrence of a plasma damage.

As shown in FIG. 7A, the gate potential necessary to saturate the drain current tends to become high after a plasma damage occurs in the device which does not embody this invention. It is therefore to be understood that the characteristic of a MOSFET will be deteriorated even if the gate oxide film is not damaged.

According to the device embodying this invention, however, there is no significant change in the relationship between the gate voltage and drain current before and after the occurrence of a plasma damage as shown in FIG. 7B. This invention will therefore neither damage the gate oxide film nor deteriorate the characteristic of a MOSFET.

Figure 8:
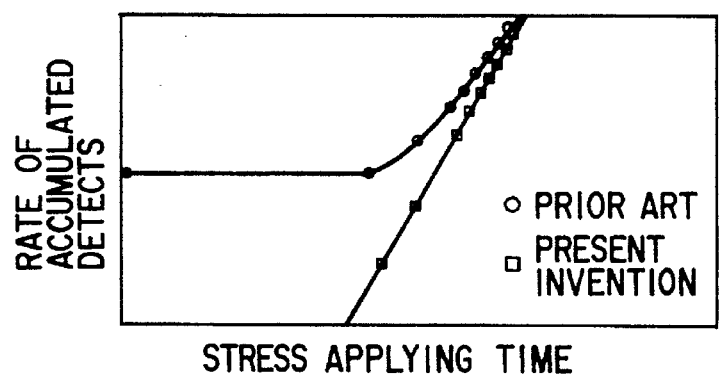
FIG. 8 is a diagram showing the relationship between the ratio of accumulated defects and the time for applying stress to the gate oxide film.

FIG. 8 presents a diagram showing the results of a TDDB test (stress test on the gate oxide film).

As shown in FIG. 8, the life of the gate oxide film is shortened in the device which does not embody this invention even if the gate oxide film is not damaged. That is, even if the gate oxide film is not damaged in the comparative device, a high voltage is applied to the gate oxide film so that carriers may be trapped in this film or a surface potential may be produced, thus deteriorating the characteristic of the gate oxide film.

According to the device embodying this invention, however, the life of the gate oxide film is longer than that of the comparative device. This proves the deterioration of the characteristic of the MOSFET in the comparative device as shown in FIG. 7A and the improvement of the same characteristic in the present device as shown in FIG. 7B.

In short, the above-described device of this embodiment will suppress a possible damage at the time fine processing using charged particles like plasma is performed, as well as will prevent a thin insulating film typified by the gate oxide film from being damaged. That is, this invention will provide a semiconductor device having a highly reliable gate oxide film.

This invention is not limited to the above particular embodiment, but may be modified in other various manners within the scope and spirit of this invention. For instance, the P⁺ diffusion layer 3 and the fuse portion 11 may be provided in a region (dicing line) on a wafer (substrate 1) where the dicer blade passes at the time of separating the wafer to individual IC chips. The provision of the diffusion layer 3 and fuse portion 11 in the dicing line will suppress an increase in the size of each IC chip.

It is apparent from the foregoing description that this invention will provide a semiconductor device that can protect an insulating film in an IC while processing the device.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor device, comprising:

a semiconductor substrate;

an integrated circuit portion formed in said semiconductor substrate;

a first level conductive layer formed on said semiconductor substrate;

a second level conductive layer formed above said first level conductive layer;

a wiring layer formed by a first portion of said first level conductive layer, said wiring layer having a first end connected to said integrated circuit portion, and a second end;

a pad formed by a first portion of said second level conductive layer, said pad connected to said wiring layer; and a fuse formed by a stacked arrangement of a second portion of said second level conductive layer and a second portion of said first level conductive layer, said fuse connected between said second end of said wiring layer and said semiconductor substrate.

2. A semiconductor device, comprising:

a semiconductor substrate;

an integrated circuit portion formed in said semiconductor substrate;

a first level conductive layer having a first node connected to said integrated circuit portion, a second node connected to said semiconductor substrate, a third node situated between said first and said second node, and a disconnectable portion which is disconnected before said integrated circuit portion is activated, said disconnectable portion situated between said second node and said third node;

a second level conductive layer formed above said first level conductive layer, said second level conductive layer having a first portion which is formed above said disconnectable portion of said first level conductive layer; and a pad formed by a second portion of a second level conductive layer, said pad connected to said third node of said first level conductive layer.

3. A semiconductor device, comprising:

a semiconductor substrate;

an integrated circuit portion formed on said semiconductor substrate;

pads for receiving power supply voltages and signal voltages when said integrated circuit portion is activated;

wiring layers, each wiring layer having a first end connected to said integrated circuit portion, a second end, and a connection node connected to a corresponding pad, said connection node situated between said first end and said second end of said wiring layer; and fuses for supplying a ground voltage from said semiconductor substrate to said second ends of said wiring layers before said integrated circuit portion is activated, said fuses connecting said wiring layers to said semiconductor substrate.

4. A semiconductor device, comprising:

a semiconductor substrate;

an integrated circuit portion formed on said semiconductor substrate;

pads for receiving power supply voltages and signal voltages when said integrated circuit portion is activated;

wiring layers, each wiring layer having a first end connected to said integrated circuit portion, a second end, and a connection node connected to a corresponding pad, said connection node situated between said first end and said second end of said wiring layer; and fuses for supplying a ground voltage from said semiconductor substrate to said pads before said integrated circuit portion is activated, said fuses connecting said pads to said semiconductor substrate.

5. A semiconductor device, comprising:

first and second power supply rails;

an integrated circuit portion connected between said first and second power supply rails;

an input/output terminal;

a wiring layer electrically connecting said input/output terminal to said integrated circuit portion;

first protecting means for protecting an insulating film of an dement of said integrated circuit portion when said first and second power supply rails and said wiring layer are in a floating state; and second protecting means for protecting the insulating film of said element of said integrated circuit when said first and second power supply rails are fixed to respective potentials.

6. The semiconductor device according to claim 5, wherein said first protecting means comprises:

a first fuse connected between said first power supply rail and a ground potential;

a second fuse connected between said second power supply rail and the ground potential; and a third fuse connected between said wiring layer and the ground potential.

7. The semiconductor device according to claim 5, wherein said second protecting means comprises:

a first diode connected between said first power supply rail and said wiring layer; and a second diode connected between said second power supply rail and said wiring layer.

8. A semiconductor device, comprising:

first and second power supply rails;

an integrated circuit portion connected between said first and second power supply rails;

an input/output terminal;

a wiring layer electrically connecting said input/output terminal to said integrated circuit portion;

first means for preventing charging up of said first power supply rail when said first power supply rail is in a floating state;

second means for preventing charging up of said second power supply rail when said second power supply rail is in a floating state; and third means for preventing charging up of said wiring layer when said wiring layer is in a floating state, wherein said first, second, and third means function to protect an insulating film of an element of said integrated circuit portion during fabrication.

9. The semiconductor device according to claim 8, wherein:

said first means includes a first fuse connected between said first power supply rail and a ground potential;

said second means includes a second fuse connected between said second power supply rail and the ground potential; and said third means includes a third fuse connected between said wiring layer and the ground potential.

10. The semiconductor device according to claim 8, further comprising:

a first diode connected between said first power supply rail and said wiring layer; and a second diode connected between said second power supply rail and said wiring layer.

11. A semiconductor device, comprising:

a semiconductor substrate;

an integrated circuit portion provided in said semiconductor substrate;

a first level conductive layer formed on said semiconductor substrate;

a second level conductive layer formed above said first level conductive layer;

a high-potential power supply pad provided on said semiconductor substrate, said high-potential power supply pad formed by a first portion of said second level conductive layer;

a high-potential power supply rail for electrically connecting said high-potential power supply pad to said integrated circuit portion, said high-potential power supply rail formed by a first portion of said first level conductive layer;

a low-potential power supply pad provided on said semiconductor substrate, said low-potential power supply pad formed by a second portion of said second level conductive layer;

a low-potential power supply rail for electrically connecting said low-potential power supply pad to said integrated circuit portion, said low-potential power supply rail formed by a second portion of said first level conductive layer;

an input/output pad which serves as an electric-signal input/output terminal for said integrated circuit portion, said input/output pad formed by a third portion of said second level conductive layer;

an input/output wiring for electrically connecting said input/output pad to said integrated circuit portion, said input/output wiring formed by a third portion of said first level conductive layer;

a first diode having an anode connected to said input/output wiring and a cathode connected to said high-potential power supply rail;

a second diode having a cathode connected to said input/output wiring and an anode connected to said low-potential power supply rail;

a first fuse which electrically connects said high-potential power supply pad to said semiconductor substrate during fabrication, thereby setting said high-potential power supply rail to the ground potential, said first fuse formed by a stacked arrangement of a fourth portion of said second level conductive layer and a fourth portion of said first level conductive layer, said fourth portion of said first level conductive layer having a smaller cross-section than said first portion of said first level conductive layer;

a second fuse which electrically connects said low-potential power supply pad to said semiconductor substrate during the fabrication, thereby setting said low-potential power supply rail to the ground potential, said second fuse formed by a stacked arrangement of a fifth portion of said second level conductive layer and a fifth portion of said first level conductive layer, said fifth portion of said first level conductive layer having a smaller cross-section than said second portion of said first level conductive layer; and a third fuse which electrically connects said input/output pad to said semiconductor substrate, thereby setting said input/output pad to the ground potential, said third fuse formed by a stacked arrangement of a sixth portion of said second level conductive layer and a sixth portion of said first level conductive layer said sixth portion of said first level conductive layer having a smaller cross-section than said third portion of said first level conductive layer.

12. A semiconductor device according to claim 11, wherein said first fuse is cut after the fabrication is complete, thereby electrically insulating said high-potential power supply rail from said semiconductor substrate, said second fuse is cut after the fabrication is complete, thereby electrically insulating said low-potential power supply rail from said semiconductor substrate, and said third fuse is cut after the fabrication is complete, thereby electrically insulating said input/output wiring layer from said semiconductor substrate.

13. A semiconductor device according to claim 12, wherein a first insulated gate type field effect transistor of a first conductivity type and a second insulated gate type field effect transistor of a second conductivity type are provided in said integrated circuit portion, and said input/output wiring electrically connects gates of said first and second insulated gate type field effect transistors to said input/output pad.

14. A semiconductor device according to claim 13, wherein a current path of said first insulated gate type field effect transistor has a first end connected to said high-potential power supply rail and a second end connected to a first end of a current path of said second insulated gate type field effect transistor, with a second end of the current path of said second insulated gate type field effect transistor connected to said low-potential power supply rail.

15. A semiconductor device according to claim 14, wherein said first and second diodes respectively protect a gate insulator of said first insulated gate type field effect transistor and a gate insulator of said second insulated gate type field effect transistor during operation.

* * * * *